United States Patent [19]

Hirano et al.

[11] Patent Number: 5,329,336
[45] Date of Patent: Jul. 12, 1994

[54] EXPOSURE METHOD AND APPARATUS

[75] Inventors: Kazuhiro Hirano; Masahiro Nei, both of Kawasaki, Japan

[73] Assignee: Nikon Corporation, Tokyo, Japan

[21] Appl. No.: 83,566

[22] Filed: Jun. 30, 1993

[30] Foreign Application Priority Data

Jul. 6, 1992 [JP] Japan .................................. 4-201895
Dec. 14, 1992 [JP] Japan .................................. 4-332745

[51] Int. Cl.⁵ ...................... G03B 27/42; G03B 27/74; G03B 27/80
[52] U.S. Cl. ........................................ 355/53; 355/68
[58] Field of Search ................... 356/401; 355/53, 68, 355/69

[56] References Cited

U.S. PATENT DOCUMENTS

| | | | |
|---|---|---|---|
| 4,828,392 | 5/1989 | Nomura et al. | 356/401 |
| 4,908,656 | 3/1990 | Suwa et al. | 355/53 |
| 4,931,830 | 6/1990 | Suwa et al. | 355/71 |
| 4,988,188 | 1/1991 | Ohta | 355/53 X |
| 5,097,291 | 3/1992 | Suzuki | 355/69 |
| 5,160,962 | 11/1992 | Miura et al. | 355/53 |

FOREIGN PATENT DOCUMENTS 61-91662 5/1986 Japan .
62-50811 10/1987 Japan .
4-268715 9/1992 Japan .

OTHER PUBLICATIONS

Naomasa Shiraishi et al., "New Imaging Technique for 64M-DRAM", SPIE vol. 1674 Optical/Laser Microlithography V (1992), pp. 741-752.

Primary Examiner—Richard A. Wintercorn
Attorney, Agent, or Firm—Shapiro and Shapiro

[57] ABSTRACT

An exposure apparatus includes
an illumination optical system (10, 1, 4) for radiating illumination light (L2) onto a mask (R) so as to expose a mask pattern (5) onto a photosensitive substrate (W),
photoelectric detection means (7) for photoelectrically detecting at least some components of the illumination light for illuminating the mask (R) or the photosensitive substrate (W),
input means (34) for inputting information associated with an incident angle range of the illumination light incident on a light-receiving surface of the photoelectric detection means (7), and
measurement means (24) for correcting a level of an output signal from the photoelectric detection means (7) in accordance with the input information, and measuring the intensity of the illumination light incident on the photoelectric detection means (7).

14 Claims, 6 Drawing Sheets

EXPOSURE METHOD AND APPARATUS

BACKGROUND OF THE INVENTION

1. Field of the Invention

The present invention relates to an exposure method and apparatus, which are used in the manufacture of, e.g., a semiconductor integrated circuit or a liquid crystal display device.

2. Related Background Art

When a circuit pattern of, e.g., a semiconductor element or a liquid crystal display element is manufactured in a photolithography process, an exposure apparatus (e.g., a stepper) for exposing a photomask or reticle (to be referred to as "reticle" hereinafter) pattern on a photosensitive substrate is used. The photosensitive substrate is prepared by coating a photosensitive material such as a photoresist on a substrate such as a semiconductor wafer or a glass substrate, and the reticle pattern is transferred on the photosensitive material. In this case, since the photosensitive material has a predetermined proper exposure amount, the conventional exposure apparatus makes the following control, so that the exposure amount on the photosensitive substrate becomes the proper exposure amount.

A reticle having an actual circuit pattern or a test reticle having a special-purpose measurement mark is set on the exposure apparatus, and exposure (test print) on the photosensitive substrate is performed while slightly changing conditions so as to obtain an optimal focal point position and a proper exposure amount. The pattern formed on the photosensitive material is observed using an optical microscope or a scanning type electron microscope to obtain optimal conditions (see U.S Pat. No. 4,908,656). In this case, the above-mentioned operation need not be performed for a reticle or a photosensitive substrate whose optimal conditions have already been known.

Thereafter, upon execution of exposure on an actual photosensitive substrate, the exposure amount is controlled using an integrator sensor comprising a photoelectric conversion element arranged in an illumination optical system of the exposure apparatus. The integrator sensor is arranged at a position almost conjugate with an exit surface side (secondary light source forming surface) of a fly-eye lens as an optical integrator arranged in the illumination optical system, and some light components of exposure light emerging from the fly-eye lens and radiated toward the photosensitive substrate are guided toward the integrator sensor by a beam splitter. In this case, the level of a photoelectric conversion signal of the integrator sensor is set in advance in correspondence with exposure energy incident on the photosensitive substrate. During exposure, the photoelectric conversion signal from the integrator sensor is integrated, and accumulated exposure energy on the photosensitive substrate is calculated based on the integrated value. When the accumulated exposure energy reaches a proper exposure amount, exposure light is shielded by, e.g., a shutter, thereby controlling the exposure amount onto the photosensitive substrate.

In the conventional normal illumination optical system, since the photoelectric conversion signal from the integrator sensor and the exposure energy on the photosensitive substrate have an almost constant, simple relationship therebetween, a good result can be obtained by the conventional exposure amount control method.

In recent years, circuit patterns of LSIs are further miniaturized, and demand for exposing a finer pattern on a photosensitive substrate with a high resolution is increased. As one of methods for meeting this demand, the numerical aperture (N.A.) of a projection optical system is increased. However, since the increase in N.A. is limited, the following various attempts have been made recently.

In a method called a phase shift method disclosed in, e.g., Japanese Patent Publication No. 62-50811, exposure is performed using a phase shift reticle prepared by forming a phase film on a light transmission portion sandwiched between chromium patterns so as to shift the phase of light transmitted through a specific portion of the reticle. With this phase shift method, a value as a coherence factor of an illumination optical system largely influences imaging performance, and in order to image a finer pattern, the a value is set to be a relatively small value (e.g., about 0.1 to 0.4).

An actual semiconductor element is normally formed by forming 20 layers or more circuit patterns to overlap each other. Since the circuit patterns of these layers require different resolutions, both normal reticles and phase shift reticles are often used. Therefore, as disclosed in, e.g.,U.S. Pat. No. 4,931,830, an exposure apparatus having an illumination optical system with a variable $\sigma$ value is required. As a method of changing the $\sigma$ value, a method of arranging a variable aperture stop near an exit surface of a fly-eye lens in the illumination optical system, i.e., a Fourier transform plane (pupil plane) of the illumination optical system with respect to a reticle pattern is known. When the $\sigma$ value is changed in this manner, the amount of light incident on the integrator sensor also changes, and exposure amount control is made based on the changed amount of light.

Furthermore, in recent years, in order to allow projection exposure with a high resolution and a large focal depth, a method called a zone illumination method (see Japanese Laid-Open Patent Application No. 61-91662) or a modified light source method (see Japanese Laid-Open Patent Application No. 4-268715, U.S. Serial No. 847,030 filed Apr. 15,1992, now abandoned, U.S. Ser. No. 791,138 filed Nov. 13, 1991, now abandoned and SPIE "Optical/Laser Microlithography V", 1992,Vol. 1674) has been proposed. In the zone illumination method, the distribution of a secondary light source (i.e., the light amount distribution of illumination light) on the Fourier transform plane of the illumination optical system with respect to a reticle pattern has a ring shape. On the other hand, in the modified light source method, the light amount distribution of illumination light on the Fourier transform plane of the illumination optical system with respect to a reticle pattern becomes maximal at least at one position separated from the optical axis by an amount corresponding to the degree of micropatterning (e.g., the pitch) of the reticle pattern. In other words, illumination light passing through the Fourier transform plane is limited to at least one partial region decentered from the optical axis.

Therefore, in either illumination method, the distribution state (light amount distribution of illumination light) and the coherence factor of illumination light on the Fourier transform plane of the illumination optical system with respect to a reticle pattern are different from those of a normal illumination method. Therefore, incident conditions (the intensity, the incident angle, the angle range, and the like of illumination light) of illumination light incident on the integrator sensor also change.

The same applies to a radiation amount monitor, placed on a stage, for measuring exposure energy of illumination light onto a wafer. This will be explained below with reference to FIG. 4.

Figure 4:
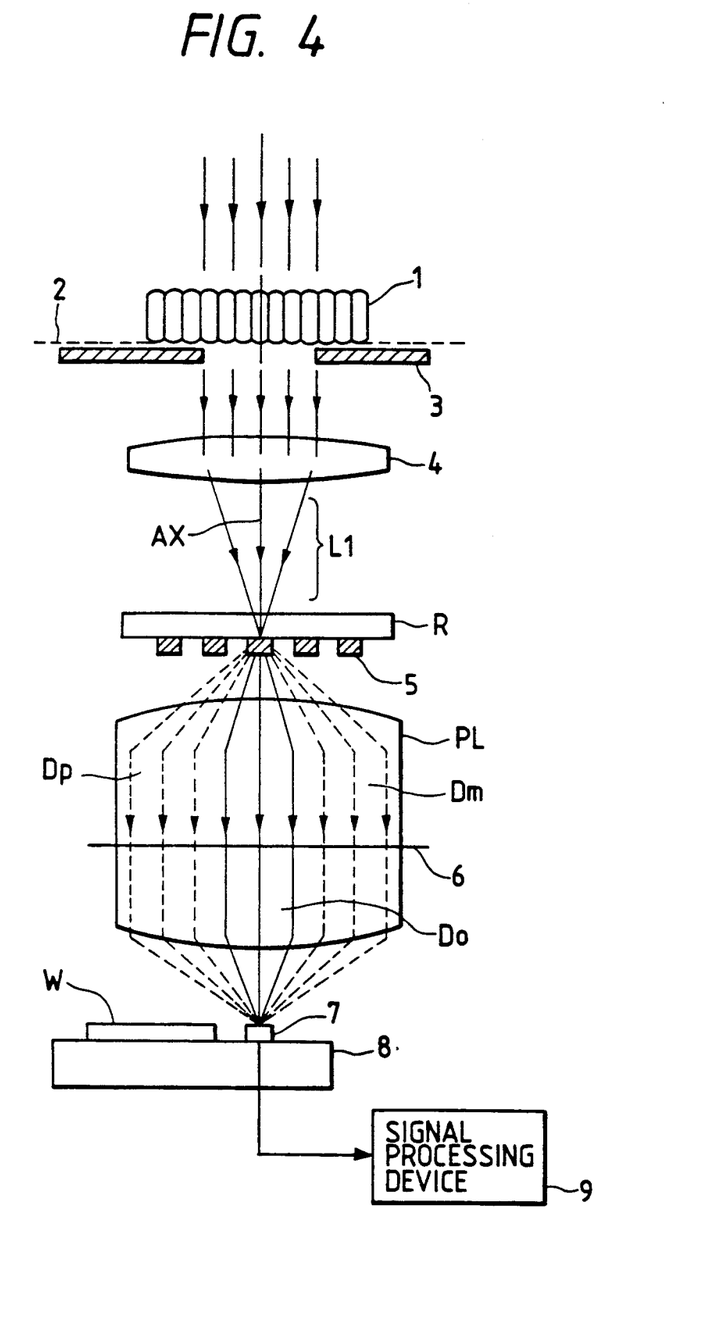
FIG. 4 is a schematic diagram showing an arrangement, after fly-eye lenses, of a conventional reduction projection type exposure apparatus.

FIG. 4 shows a schematic arrangement of the above-mentioned conventional reduction production type exposure apparatus (stepper). In FIG. 4, illumination light L1 from a light source (not shown) is collimated into a parallel light beam, and the parallel light beam is incident on a fly-eye lens 1. The illumination light L1 emerging from the fly-eye lens 1 is almost vertically incident on a pattern 5 on a reticle R via a spatial filter (aperture stop) 3 and a condenser lens 4. An image of the pattern 5 on the reticle R is formed on the best imaging plane by a projection optical system PL.

The spatial filter 3 is arranged on or near a reticle-side focal plane 2, i.e., the Fourier transform plane (to be referred to as "pupil plane" hereinafter) of the fly-eye lens 1 with respect to the pattern 5 on the reticle R. The spatial filter 3 has an almost circular or rectangular aperture having an optical axis AX of the projection optical system PL as a center, and limits a two-dimensional secondary light source image formed in the pupil plane to a circular (or rectangular) shape. A wafer stage 8 is movably arranged below the projection optical system PL, and a wafer W is held on the wafer stage 8. A radiation amount monitor 7 comprising a photoelectric conversion element is fixed near the wafer W on the wafer stage 8, so that the light-receiving surface of the monitor 7 is arranged at the same level as that of the exposure surface of the wafer W.

The wafer stage 8 is constituted by an XY stage for positioning the wafer W and the radiation amount monitor 7 in a plane perpendicular to the optical axis AX of the projection optical system PL, a Z stage for positioning the wafer W and the radiation amount monitor 7 in the direction of the optical axis AX, and the like. When exposure is performed on the wafer W, the wafer W is set in the exposure region of the projection optical system PL, and the image of the pattern 5 on the reticle R is formed and exposed on each shot region on the wafer W. When exposure energy of illumination light onto the wafer W is to be measured, the wafer stage 8 is driven to set the light-receiving surface of the radiation amount monitor 7 in the exposure region of the projection optical system PL, and the image of the pattern 5 on the reticle R is projected onto the light-receiving surface of the radiation amount monitor 7. The output signal from the radiation amount monitor 7 is supplied to a signal processing device 9. The light-receiving surface of the radiation amount monitor 7 is set to be perpendicular to the optical axis AX of the projection optical system PL, and illumination light is almost vertically incident on the light-receiving surface of the radiation amount monitor 7. The illumination light L1 incident on the reticle R falls within a predetermined incident angle range having the optical axis AX as the center, and +1st-order diffracted light Dp, -1st-order diffracted light Dm, and the like emerge from the pattern 5 on the reticle R in addition to 0th-order diffracted light D0. Therefore, the incident angle of the illumination light incident on the radiation amount monitor 7 is distributed within a predetermined range to have 0 as the center. More specifically, the average value of incident angles of the illumination light incident on the radiation amount monitor 7 is 0.

Since the diameter of the circular aperture of the spatial filter 3 shown in FIG. 4 is constant, the signal processing device 9 multiplies a photoelectric signal output from the radiation amount monitor 7 with a predetermined conversion coefficient, thus calculating the amount of radiation energy radiated on the wafer W.

However, in an illumination optical system whose value is variable within a range from 0.1 to 0.8, if the conversion coefficient in the signal processing device 9 is constant, the amount of radiation energy calculated from the level of the photoelectric signal suffers from an error. For example, when the $\sigma$ value is changed from 0.6 to 0.2, if the ratio between the two amounts of radiation energy obtained by the signal processing device 9 almost coincides with the ratio between $\sigma$ values, i.e., the area ratio of the aperture in the pupil plane of the illumination optical system (almost corresponding to the ratio of a light source image present in the aperture), a precise amount of radiation energy can be calculated regardless of the $\sigma$ value. However, when the $\sigma$ value is changed, incident conditions (the incident angle, the range of the incident angle, and the like) of illumination light with respect to the radiation amount monitor 7 also change. For this reason, even if a precise amount of radiation energy is obtained when the $\sigma$ value is 0.2, the amount of radiation energy calculated when the G value is 0.6 is not always precise, i.e., does not always coincide with the amount of light actually incident on the radiation amount monitor 7. More specifically, in an illumination optical system with a variable $\sigma$ value, a precise amount of radiation amount (illumination light intensity) cannot be obtained by the radiation amount monitor or integrator sensor in units of conditions. This problem similarly occurs not only in the illumination optical system with a variable o value but also in an illumination optical system which can adopt the zone illumination method or modified light source method. For example, the same problem is posed in the zone illumination method when the inner or outer diameter or the zone ratio (ratio between the inner and outer diameters) of a ring-shaped region is changed; in the modified light source method when the positions where the light amount distribution of illumination light in the pupil plane of the illumination optical system becomes maximal are changed or the number of such positions is changed; and when the normal illumination method, the zone illumination method, and the modified light source method are selectively used as needed.

As described above, when the illumination conditions for a reticle are changed, in other words, when the light amount distribution of illumination light in the pupil plane of the illumination optical system is changed, the incident conditions of illumination light incident on the integrator sensor or the radiation amount monitor also change. For this reason, even when the intensity of illumination light incident on the integrator sensor remains the same before and after the illumination conditions are changed, the level of a photoelectric signal output from the sensor changes. That is, the intensity (or amount of radiation energy) of illumination light radiated onto the sensor cannot be precisely measured. In a projection exposure apparatus, exposure control is performed using the output signal from the integrator sensor. In this case, exposure amount control precision is lowered for the above-mentioned reason, and a reticle pattern cannot be precisely exposed on a photosensitive substrate.

Even when a reticle is changed from a normal reticle to a phase shift reticle (or vice versa) without changing the illumination conditions, the incident conditions of illumination light emerging from the projection optical system and incident on the radiation amount monitor change. Furthermore, as the phase shift reticle, a spatial frequency modulation type reticle, an edge emphasis type reticle, a shifter light-shielding type reticle, a halftone type reticle and the like have been proposed. If phase shift reticles of different types are used, the incident conditions of illumination light on the radiation amount monitor change. Therefore, the intensity (or amount of radiation energy) of illumination light cannot be precisely measured especially by the radiation amount monitor even when the reticle type is changed.

SUMMARY OF THE INVENTION

It is an object of the present invention to provide a method and apparatus, which can always precisely measure the intensity of illumination light regardless of illumination conditions on a reticle and a reticle type.

Figure 5:
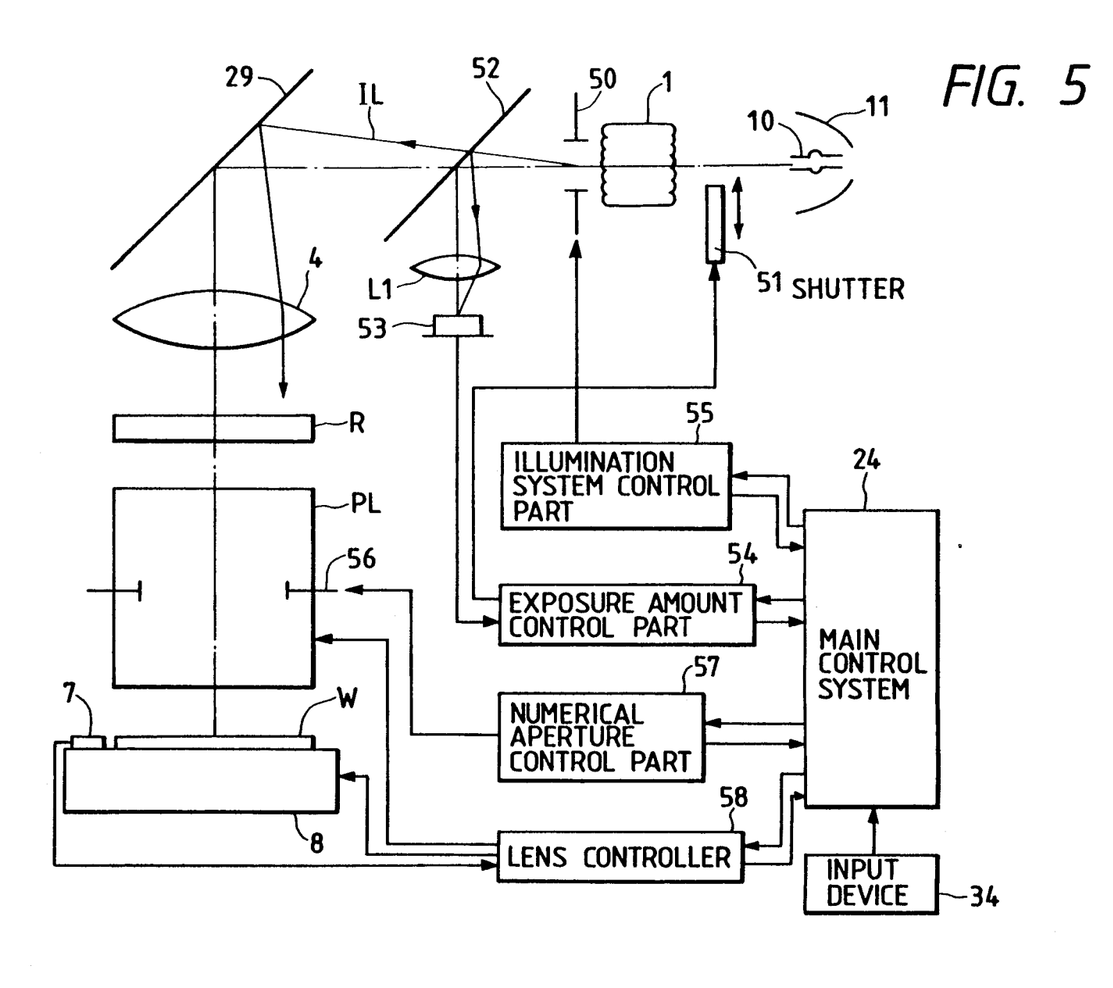
FIG. 5 is a diagram showing an arrangement of a projection exposure apparatus according to the second embodiment of the present invention.

As shown in, e.g., FIG. 5, an exposure apparatus according to the present invention includes:

an illumination optical system (10, 1, 4) for radiating illumination light (L2) onto a mask (R) so as to expose a mask pattern (5) onto a photosensitive substrate (W);

photoelectric detection means (7) for photoelectrically detecting at least some components of the illumination light for illuminating the mask (R) or the photosensitive substrate (W);

input means (34) for inputting information associated with an incident angle range of the illumination light incident on a light-receiving surface of the photoelectric detection means (7); and measurement means (24) for correcting a level of an output signal from the photoelectric detection means (7) in accordance with the input information, and measuring the intensity of the illumination light incident on the photoelectric detection means (7).

According to the present invention, in order to change the illumination optical system in accordance with the mask (R), the input means (34) designates an interval between a first lens barrel portion (22A) and a second lens barrel portion (22B) to a main control system (24). In this case, when the light amount distribution of illumination light in the pupil plane of the illumination optical system is changed, since the incident conditions (the incident angle and the range of the incident angle) of illumination light incident on the photoelectric detection means (7) change, conversion efficiency between the intensity of the illumination light incident on the photoelectric detection means (7) and the output signal from the photoelectric detection means (7) changes.

Thus, the main control system (24) calculates an average value $\phi$ of the incident angles of the illumination light incident on the photoelectric detection means (7) on the basis of the input interval between the first and second lens barrel portions (22A, 22B). For example, when the incident angle of the illumination light is $\phi$, the main control system sets the output signal from the photoelectric detection means (7) to be $I(\phi)$. The main control system (24) corrects the output signal $I(\phi)$ by calculating, e.g., $I(\phi) \cdot f(\phi)$ using a predetermined conversion coefficient $f(\phi)$ determined on the basis of the incident angle $\phi$. With this correction, the precise intensity of illumination light incident on the photoelectric detection means (7) can be calculated. Furthermore, the exposure amount on the photosensitive substrate (W) can be precisely controlled on the basis of the corrected signal $I(\phi) \cdot f(\phi)$.

DESCRIPTION OF THE PREFERRED EMBODIMENTS

Figure 1:
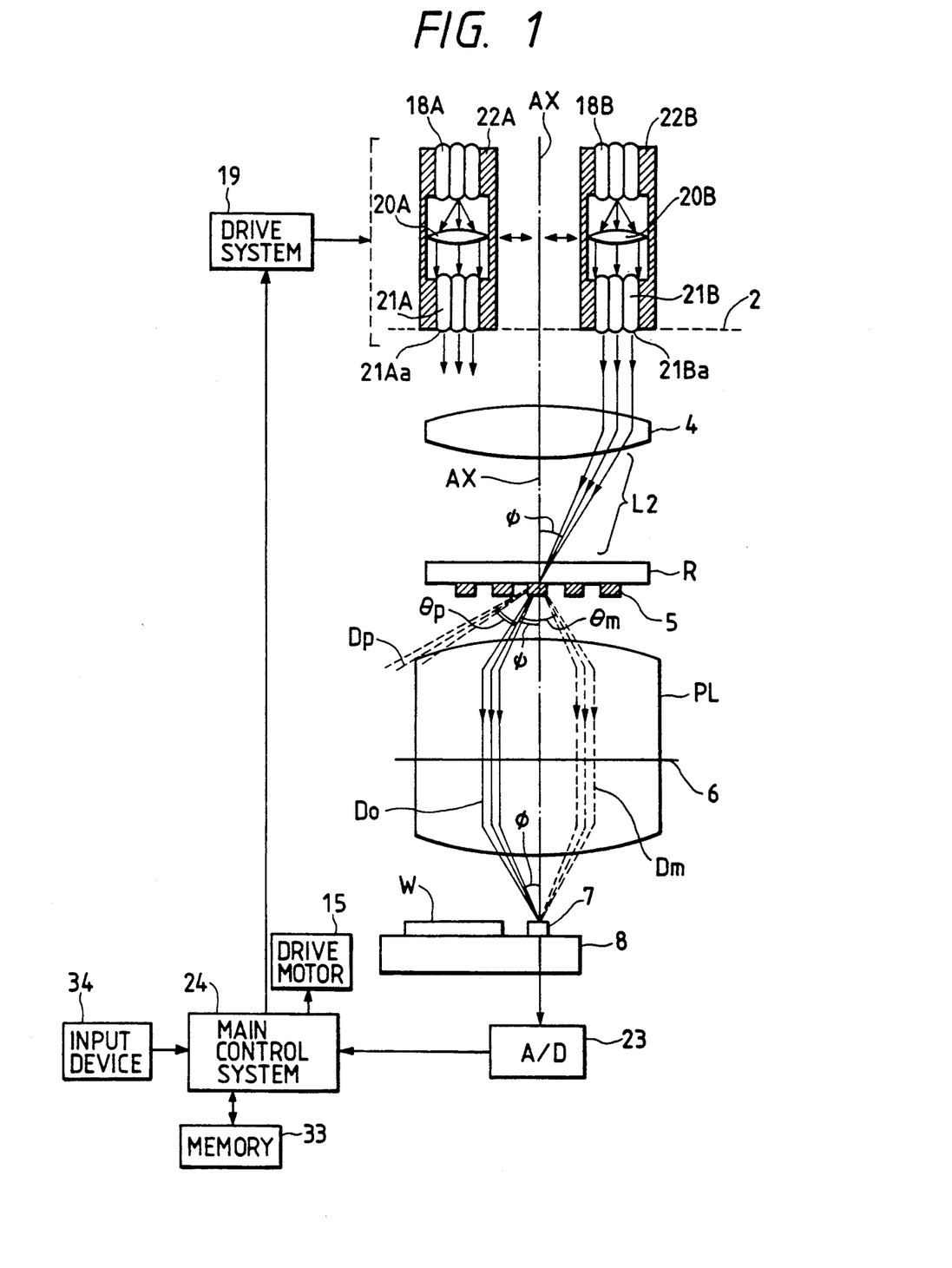
FIG. 1 is a diagram showing an arrangement, after fly-eye lenses, of a projection exposure apparatus according to the first embodiment of the present invention.
Figure 2:
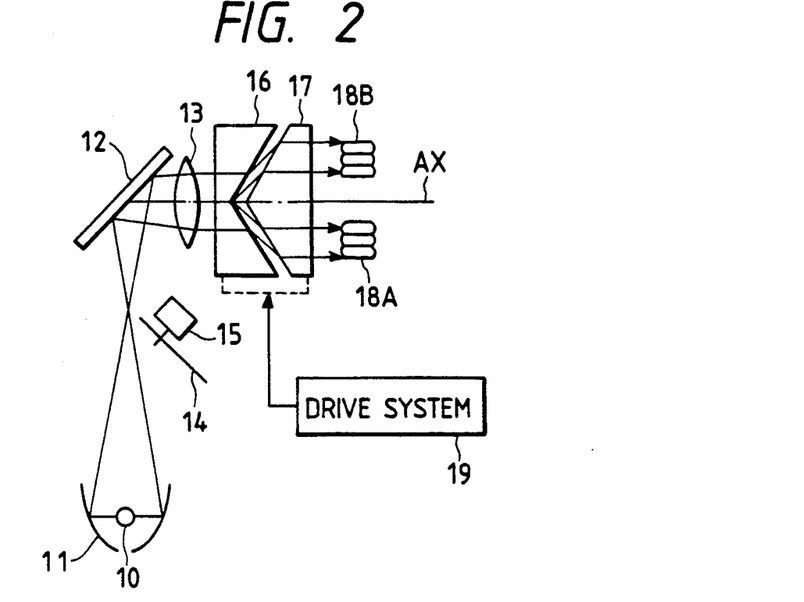
FIG. 2 is a diagram showing an optical system from a light source to fly-eye lenses, which system is used in the projection exposure apparatus shown in FIG. 1.

FIGS. 1 and 2 show a schematic arrangement of a projection exposure apparatus according to the first embodiment of the present invention. In this embodiment, the present invention is applied to a projection exposure apparatus adopting a modified light source method (inclined illumination method).

FIG. 2 shows an arrangement around a light source of this embodiment. In FIG. 2, illumination light emitted from a light source 10 is incident on an input lens 13 via an elliptic mirror 11 and a reflection mirror 12, and emerges from the input lens as an almost parallel light beam. A shutter 14 is arranged between the elliptic mirror 11 and the reflection mirror 12, and an optical path is opened/closed by driving the shutter 14 using a drive motor 15, thereby stopping supply of illumination light to the input lens 13, as needed. The light source 10 can comprise, e.g., an excimer laser light source for emitting a KrF excimer laser beam in addition to a mercury lamp. When the excimer laser light source is used, a beam expander and the like are additionally inserted in the optical system from the elliptic mirror 11 to the input lens 13.

After the input lens 13, a first polygonal prism 16 having a V-shaped recess portion, and a second polygonal prism 17 having an inverted-V shaped projecting portion are arranged in turn. Illumination light emerging from the input lens 13 is guided to the second polygonal prism 17 via the first polygonal prism 16. The illumination light emerging from the second polygonal prism 17 is split into two beams symmetrical about the optical axis AX and decentered by a predetermined amount from the optical axis AX, and these two beams are respectively incident on fly-eye lenses 18A and 18B. In this case, the interval between the two light beams emerging from the second polygonal prism 17 can be adjusted by adjusting the interval, in the direction of the optical axis AX, between the first and second polygonal prisms 16 and 17 by a drive system 19. Also, when the first and second polygonal prisms 16 and 17 are integrally moved in a plane perpendicular to the optical axis AX, the intensities of the two light beams can be equalized.

In this embodiment, inclined illumination is achieved using two light beams. When inclined illumination is achieved using four light beams, a polygonal prism having a quadrangular pyramid-shaped (pyramid-shaped) recess portion may be arranged in place of the first polygonal prism 16, and a polygonal prism having a quadrangular pyramid-shaped recess portion may be arranged in place of the second polygonal prism 17. With this arrangement, illumination light emerging from the input lens 13 is split into four light beams (passing vertices of a square or rectangle in the pupil plane of the illumination optical system) at almost 90° angular intervals to have the optical axis Ax as the center.

FIG. 1 is a diagram showing an arrangement after the fly-eye lenses 18A and 18B shown in FIG. 2. In FIG. 1, one illumination light beam from the second polygonal prism 17 (FIG. 2) is incident on the first fly-eye lens 18A of a second group. The light beam emerging from the first fly-eye lens 18A is incident on a first fly-eye lens 21A of a first group via a guide optical system 20A. On the other hand, the other illumination light beam from the second polygonal prism 17 (FIG. 2) is incident on the second fly-eye lens 18B of the second group. The light beam emerging from the second fly-eye lens 18B is incident on a second fly-eye lens 21B of the first group via a guide optical system 20B. The illuminance distributions of illumination light on the incident surfaces of the fly-eye lenses 21A and 21B of the first group are uniformed by the fly-eye lenses 18A and 18B of the second group.

The first fly-eye lenses 18A and 21A, and the guide optical system 20A are stored in a first lens barrel portion 22A, and the second fly-eye lenses 18B and 21B, and the guide optical system 20B are stored in a second lens barrel portion 22B.

Illumination light L2 emerging from the fly-eye lenses 21A and 21B of the first group is radiated onto a pattern 5 on a reticle R via a condenser lens 4. The illuminance distribution of illumination light on the reticle R is uniformed twice by the fly-eye lenses of the first and second groups, and has very good uniformity. With this illumination light, the image of the pattern 5 on the reticle R is formed, via a projection optical system PL, on the exposure surface of a wafer W or the light-receiving surface of a radiation amount monitor 7 comprising a photoelectric conversion element on a wafer stage 8. When radiation energy to the wafer W is to be monitored, the radiation amount monitor 7 is arranged in an exposure region of the projection optical system PL, and a photoelectric conversion signal from the radiation amount monitor 7 is supplied to a main control system 24 via an analog/digital (A/D) converter 23.

The main control system 24 is connected to an input device 34 such as a keyboard. An operator designates the interval between the first and second lens barrel portions 22A and 22B to the main control system 24 using the input device 34. As the input device 34, for example, an input device comprising a CRT display and a so-called mouse, a data file storing various exposure conditions (e.g., an exposure region, exposure energy, an offset of a focus position, and the like), a bar code reader for reading a bar code provided to a reticle, or the like may be used. In this case, the data file or the bar code can store information associated with illumination conditions for a reticle, i.e., the central position (the position of center of gravity of the light amount distribution of illumination light) of each fly-eye lens in a pupil plane 2 of the illumination optical system in this embodiment. Also, the type (a normal reticle, a phase shift reticle, or the like) of the reticle R, the minimum pitch of a pattern to be transferred, and the like may be input to the input device 34. The information (the interval between the first and second lens barrel portions 22A and 22B) input from the input device 34 is stored in a storage means (memory) 33.

Also, information associated with the interval between the first and second lens barrel portions 22A and 22B is always supplied from the drive system 19 to the main control system 24. The main control system adjusts, via the drive system 19, the interval between the two polygonal prisms 16 and 17 (FIG. 2) and the interval, in the direction perpendicular to the optical axis AX, between the two lens barrel portions 22A and 22B (FIG. 3) on the basis of the information stored in the memory 33. The main control system 24 calculates the intensity of illumination light incident on the wafer W on the basis of the photoelectric signal obtained from the radiation amount monitor 7 and the information stored in the memory 33, and controls the drive operation of the drive motor 15 for exposure amount control. In this manner, the main control system systematically controls the entire apparatus.

In FIG. 1, the centers of the fly-eye lenses 21A and 21B of the first group are located at positions separated from the optical axis AX of the illumination optical system. Reticle-side focal planes 21Aa and 21Bb of the fly-eye lenses 21A and 21B of the first group almost coincide with the Fourier transfer plane 2 with respect to the pattern 5 on the reticle R. Thus, if the distance between the optical axis AX and the center (the position of center of gravity of the light amount distribution of illumination light) of each of the fly-eye lenses 21A and 21B of the first group is represented by R, the focal length of the condenser lens 4 is represented by f, and the incident angle of a principal ray of the illumination light L2 with respect to the reticle R is represented by $\psi$, they satisfy:

$$f \tan\psi = R$$

Therefore, the main control system 24 can calculate the incident angle $\psi$ of the principal ray of the illumination light L2 with respect to the reticle R on the basis of the distance R between the optical axis AX and the center of each of the fly-eye lenses 21A and 21B of the first group.

The pattern 5 such as a circuit pattern drawn on the reticle R normally includes many periodic patterns. Therefore, when illumination light L2 from one fly-eye lens 21B is radiated onto the pattern 5 on the reticle R, 0th-order diffracted light D0, +1st-order diffracted light Dp, -1st-order diffracted light Dm, and higher-order diffracted light components are generated from the pattern 5 in directions determined according to the degree of micropatterning of the pattern.

At this time, since the principal ray of the illumination light is incident on the reticle R at an angle inclined from the optical axis AX, the diffracted light components of the respective orders are generated from the pattern 5 on the reticle R in an inclined state (in a state having an angular shift) as compared to a case wherein illumination light is vertically incident on the reticle R. More specifically, the illumination light L2 is incident on the reticle R to be inclined at the angle $\psi$ with respect to the optical axis AX. At this time, 0th-order diffracted light DO which propagates in the direction inclined at the angle $\psi$ with respect to the optical axis AX, -1st-order diffracted light Dm which propagates in the direction inclined from the 0th-order diffracted light by an angle $\theta$m toward the optical axis AX, and +1st-order diffracted light Dp which propagates in the direction inclined by an angle $(\theta p+\psi)$ with respect to the optical axis AX are generated from the pattern 5 on the reticle R. If the pitch, in the direction parallel to the plane of drawing of FIG. 1, of the pattern 5 on the reticle R is represented by P, and the wavelength of the illumination light L2 is represented by $\lambda$, the above diffraction angles $\theta$p and $\theta$m respectively satisfy:

$$\sin(\theta p+\psi)-\sin\psi=\lambda/p \quad (1)$$

$$\sin(\theta m-\psi)+\sin\psi=\lambda/p \quad (2)$$

In this case, assume that both the +1st-order diffracted light Dp and -1st-order diffracted light Dm are transmitted through a pupil 6 of the projection optical system PL.

When the diffraction angles $\theta$p and $\theta$m increase according to an increase in degree of micropatterning of the pattern 5 on the reticle R, the +1st-order diffracted light Dp propagating in the direction of the angle $(\theta p+\psi)$ cannot be transmitted through the aperture of the pupil plane 6 of the projection optical system PL. More specifically, if the numerical aperture at the incidence side of the projection optical system PL is represented by NAr, $\sin(\theta p+\psi)>$ NAr is satisfied. However, since the illumination light L2 is incident obliquely with respect to the optical axis AX, the -1st-order diffracted light Dm is transmitted through the projection optical system PL even at the diffraction angle at that time. More specifically, $\sin(\theta m-\psi)>$NAr is satisfied. Therefore, the two beams, i.e., the 0th-order diffracted light DO and the -1st-order diffracted light Dm are incident on the wafer stage 8 to be respectively inclined at the angle $\psi$ and the angle $(\theta m-\psi)$ with respect to the optical axis AX. Note that the positions, in a plane perpendicular to the optical axis AX, of the lens barrel portions 22A and 22B can be changed according to the degree of micropatterning (pitch, duty, and the like), the periodic direction, and the like of the pattern 5 on the reticle R.

When the positions, in the plane perpendicular to the optical axis AX, of the lens barrel portions 22A and 22B are changed, the distance between the optical axis AX and the center of each of the fly-eye lenses 21A and 21B of the first group is changed. Therefore, the average value $\phi$ of incident angles of illumination light on the light-receiving surface of the radiation amount monitor 7 changes. If the magnification of the projection optical system PL is represented by M, the average value $\psi$ of incident angles on the reticle R and the average value $\phi$ of incident angles on the radiation amount monitor 7 have the following relationship therebetween:

$$\sin\phi=(\sin\psi)/M$$

For example, if the magnification M = 1, $\phi=\psi$.

If the value of the incident angle $\phi$ changes, the conversion efficiency between the light-receiving amount on the radiation amount monitor 7 and the output signal amount changes. More specifically, when the value of the incident angle $\phi$ becomes large, the value (level) of a signal output from the radiation amount monitor 7 becomes small even if the intensity of illumination light actually received by the radiation amount monitor 7 is constant. In this state, it is difficult to precisely measure the light amount. Therefore, the main control system 24 measures the intensity of illumination light incident on the radiation amount monitor 7 on the basis of a signal obtained from the input device 34 and the output signal from the radiation amount monitor 7.

An output current $I(\phi)$ output from the radiation amount monitor 7 obtained when illumination light is incident on the light-receiving surface of the radiation amount monitor 7 at the incident angle $\phi$, and exposure energy $E(\phi)$ obtained when the wafer W is exposed with the illumination light for a predetermined period of time are actually measured.

Assume that $E(O)=K\cdot I(0)$ is satisfied when the incident angle $\phi=0$. When the incident angle $\phi$ (the distance between the optical axis AX and each fly-eye lens of the first group) is changed while the amount of illumination light emitted from the light source is kept constant, the output current $I(\phi)$ and the exposure energy $E(\phi)$ can be expressed as follows using a correction amount $f(\phi)$:

$$E(\phi)=K\cdot I(\phi)\cdot f(\phi) \quad (3)$$

Note that the value $I(\phi)\cdot f(\phi)$ is the precise intensity of illumination light incident on the radiation amount monitor 7. When the correction value $f(\phi)$ is obtained by actual measurement, Table 1 below is obtained.

TABLE 1

| Distance between optical axis AX and fly-eye lens of first group (mm) | Incident angle $\phi$ on radiation amount monitor (DEG) | Correction amount $f(\phi)$ | Corrected value when output current = 100 |
|---|---|---|---|
| 30 | 3.43 | 1.04 | 104 |
| 40 | 4.57 | 1.05 | 105 |
| 50 | 5.71 | 1.06 | 106 |
| 60 | 6.84 | 1.08 | 108 |
| 80 | 9.09 | 1.10 | 110 |
| 100 | 11.30 | 1.13 | 113 |
| 120 | 13.49 | 1.14 | 114 |
| 140 | 15.64 | 1.16 | 116 |

These correction values $f(\phi)$ are stored in the memory 33 in correspondence with the interval between the first and second lens barrel portions 22A and 22B or the incident angle $\phi$. The correction amounts $f(\phi)$ may be stored in the memory 33 as a function of the incident angle $\phi$.

In Table 1, an output signal obtained from the radiation amount monitor 7 when $\phi=0$ is used as a reference signal (assume that $E(0)=K\cdot I(0)$ is satisfied when the incident angle $\phi=0$). However, in the apparatus shown in FIG. 1, when the incident angle $\phi$ cannot be set to be 0, i.e., when the distance between the optical axis AX and each fly-eye lens of the first group cannot be set to be 0, a state wherein the conversion efficiency between the light-receiving amount of the radiation amount monitor 7 and the output current amount is almost equal to that obtained when the incident angle $\phi=0$ is used as a reference state. Therefore, the correction amount $f(\phi)$ is calculated with reference to an output signal obtained from the radiation amount monitor 7 when the distance between the optical axis AX and each fly-eye lens of the first group is, e.g., 10 mm.

For example, the first lens barrel portion 22A is moved to cause the center of the first fly-eye lenses 18A and 21A to coincide with the optical axis AX, and the second lens barrel portion 22B is arranged, so that illumination light emerging from the second fly-eye lenses 18B and 21B is not incident on the condenser lens 4. With this arrangement, illumination light emerging from the first fly-eye lenses 18A and 21A is incident on the radiation amount monitor 7 at the incident angle $\phi=0$. An output signal Ih obtained from the radiation amount monitor 7 at this time may be used as a reference signal. However, since illumination light beams emerging from both the first and second fly-eye lenses 21A and 21B are used, the reference exposure energy E(0) is given by E(0)=K·2Ih.

When the main control system 24 calculates the exposure energy of illumination light on the basis of the output current $I(\phi)$ of the radiation amount monitor 7, it detects the correction amount $f(\phi)$ corresponding to the current distance between the optical axis AX and the center (the position of center of gravity of the light amount distribution of illumination light) of the fly-eye lens 21A (or 21B) in accordance with the information stored in the memory 33. The main control system 24 calculates precise exposure energy $E(\phi)$ by calculating equation (3). Thus, even when the principal ray of illumination light onto the reticle R is inclined, accumulated exposure energy on the wafer W can be precisely detected. When the accumulated exposure amount reaches a proper exposure amount for the wafer W, the main control system 24 controls the drive motor 15 to close the shutter 14, thus allowing precise exposure amount control. In practice, since the open/close control of the shutter 14 cannot be performed using the output from the radiation amount monitor 7 during exposure, the radiation amount monitor 7 is arranged in advance in the exposure region of the projection optical system, the shutter 14 is opened/closed to obtain a proper exposure amount according to a resist, and the open time of the shutter 14 at this time can be stored in the memory 33.

When the correction calculation is performed on software of the main control system 24, an error of an output for each of the radiation amount monitor 7 can be easily corrected by changing the value of the correction amount $f(\phi)$. When the relationship $f(\phi)$ between the incidence angle of illumination light and the conversion efficiency of the radiation amount monitor 7 is not complicated, the calculation of equation (3) may be executed on hardware.

In equation (3), the output current $I(\phi)$ is multiplied with the correction amount $f(\phi)$. However, a simpler formula may be used. That is, an offset amount $q(\phi)$ corresponding to the average value $\phi$ of the incident angles may be calculated, and the offset amount $q(\phi)$ may be added to $K \cdot I(\phi)$.

A modification of this embodiment will be described below with reference to FIG. 3. In this modification as well, the optical system up to the fly-eye lenses of the first group is the same as that shown in FIG. 2.

Figure 3:
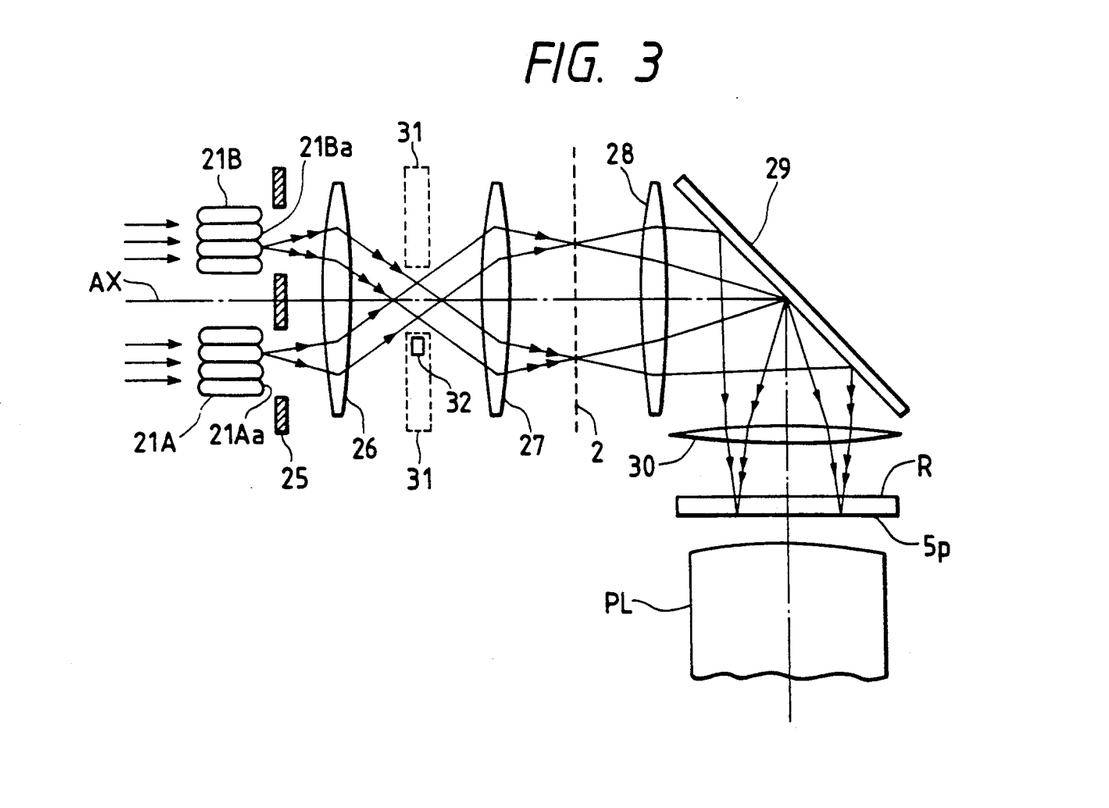
FIG. 3 is a schematic diagram showing an arrangement, after fly-eye lenses, of a projection exposure apparatus according to a modification of the first embodiment of the present invention.

FIG. 3 shows an optical system after the fly-eye lenses of the first group of this modification. In FIG. 3, an aperture stop 25 is arranged on the exit surfaces 21Aa and 21Bb of the fly-eye lenses 21A and 21B of the first group, i.e., the Fourier transform plate with respect to the pattern 5 on the reticle R. Illumination light beams emerging from two apertures, decentered from the optical axis AX, of the aperture stop 25 are focused by a first relay lens 26. At this time, a plane conjugate with the pattern 5 on the reticle R is formed due to the effect of the first relay lens 26. A variable field stop (variable reticle blind) 31 is arranged on this conjugate plane, thereby limiting an illumination area on the pattern formation surface of the reticle R.

The illumination light beams transmitted through the variable field stop 31 are radiated onto the reticle R via a second relay lens 27, a sub condenser lens 28, a mirror 29, and a main condenser lens 30. A Fourier transform plane 2 with respect to a pattern surface 5p on the reticle R is formed between the second relay lens 27 and the sub condenser lens 28.

In this modification, an integrator sensor 32 comprising a photoelectric conversion element is arranged on the surface portion, near the aperture and at the side of the aperture stop 25, of the variable field stop 31. Therefore, the integrator sensor 32 is arranged on a plane (conjugate plane) having an imaging relationship with the pattern 5 on the reticle R. Since the area of a light beam emerging from the first relay lens 26 is wider than that of the aperture of the variable field stop 31, illumination light including the inclined principal ray from the fly-eye lens 21A (or 21B) is always radiated on the light-receiving surface of the integrator sensor 32.

Therefore, illumination light incident on the light-receiving surface of the integrator sensor 32 does not include any vertical illumination light component, and conversion efficiency between the radiation energy onto the light-receiving surface and the output current is changed from that in the prior art. Thus, as for the relationship between the output signal from the integrator sensor 32 and exposure energy onto the wafer W, a correction function as in Table 1 is calculated in correspondence with the distance between the fly-eye lens 21A (or 21B) and the optical axis AX, and sensitivity correction is performed based on this correction function. When a light amount accumulation circuit accumulates exposure energy after the sensitivity correction, accumulated exposure energy on the wafer W can be precisely detected.

Note that the arrangement of the integrator sensor is not limited to the above embodiment. For example, a beam splitter for guiding some components of illumination light to the integrator sensor may be arranged between the second fly-eye lenses 18B and 21B in FIG. 1. Also, the radiation amount monitor may be arranged near the reticle R.

When a spatial frequency modulation type, an edge emphasis type, or a shifter light-shielding type phase shift reticle (see Japanese Patent Publication No. 62-50811), a halftone type phase shift reticle disclosed in, e.g., U.S. Ser. No. 780,249 (filed: Oct. 22, 1991 now abandoned or the like is used, the incident angle range of illumination light incident on the wafer or the radiation amount monitor changes (has an inclination angle) as in the above embodiment. Therefore, when a phase shift reticle or the like is used, the present invention can be applied to obtain the same effect as in the above embodiment. When a variable aperture stop is arranged on or near the pupil plane 6 of the projection optical system PL to obtain a variable numerical aperture of the projection optical system PL, the present invention can be applied to obtain the same effect as in the above embodiment.

FIG. 5 is a diagram showing a schematic arrangement of a projection exposure apparatus according to the second embodiment of the present invention. In this embodiment, the present invention is applied to an exposure apparatus which can change illumination conditions of an illumination optical system in correspondence with a reticle, in particular, a projection exposure apparatus having an illumination optical system, which can vary a $\sigma$ value. Note that the same reference numerals in FIG. 5 denote the same parts as in FIG. 1 or 4.

In FIG. 5, illumination light IL emitted from a light source 10 is focused by an elliptic mirror 11, and is collimated into an almost parallel light beam by an input lens (not shown). The parallel light is incident on a fly-eye lens 1. A shutter 51 is removably arranged in the optical path between the light source 10 and the fly-eye lens 1. The shutter 51 controls the exposure amount (exposure energy amount) on a photosensitive substrate.

A large number of secondary light sources are formed on a rear-side (reticle-side) focal plane of the fly-eye lens 1, and a variable aperture stop 50 is arranged on this secondary light source formation plane. The arranging plane of the variable aperture stop 50 is also a Fourier transform plane (pupil plane) of an illumination optical system of this embodiment. When the distribution state of secondary light sources on the Fourier transform plane is changed by the variable aperture stop 50, illumination conditions for various reticles are optimized. More specifically, with the variable aperture stop 50, the coherency factor ($\sigma$ value) of the illumination optical system can be set to be a desired value, and for example, a zone illumination method or a so-called modified light source method can also be realized. Note that the aperture stop may be replaced with another one in place of changing the shape and size of the variable aperture stop 50.

The illumination light IL passing through the aperture of the variable aperture stop 50 is incident on a beam splitter 52 having a high transmittance and a low reflectance. The illumination light reflected by the beam splitter 52 is incident on the light-receiving surface of an integrator sensor 53 comprising a photoelectric conversion element (e.g., a silicon photodiode) by a focusing lens L1. In this case, with the focusing lens L1, the arranging plane of the variable aperture stop 50, i.e., the Fourier transform plane of the illumination optical system is almost conjugate with the light-receiving surface of the integrator sensor 53. The output signal from the integrator sensor 53 is supplied to an exposure amount control part 54, which controls an opening/closing operation of the shutter 51. An illumination system control part 55 sets the shape and size of the aperture of the variable aperture stop 50 in a state instructed from a main control system 24.

The illumination light IL transmitted through the beam splitter 52 is reflected vertically downward by a mirror 29, and is focused by a condenser lens 12 to illuminate a reticle R with a uniform illuminance. An image of a pattern formed on the reticle R is reduced to a predetermined reduction scale via a projection optical system PL, and is projected and exposed on a wafer W coated with a photosensitive material.

A variable aperture stop 56 is arranged on a Fourier transform plane (pupil plane) of the projection optical system PL. A numerical aperture control part 57 controls the state of the aperture of the variable aperture stop 56, thereby setting the numerical aperture (N.A.) of the projection optical system PL to be a predetermined value. A wafer W is placed on a wafer stage 8, and a radiation amount monitor 7 comprising a photoelectric conversion element is arranged near the wafer W.

The detection signal from the radiation amount monitor 7 is supplied to a lens controller 58, and the operation of the lens controller 58 is controlled by the main control system 24. The main control system 24 controls the operations of the exposure amount control part 54, the illumination system control part 55, and the numerical aperture control part 57, and also supplies opening/closing information of the shutter 51 from the exposure control part 54 to the lens controller 58. It is Generally known that, when illumination light continuously passes through the projection optical system PL, the arrangements or shapes of the lens elements constituting the projection optical system PL change due to the radiation energy of illumination light, and the imaging characteristics of the projection optical system PL temporally vary. Thus, the lens controller 58 always monitors the temporal variation of the imaging characteristics of the projection optical system PL on the basis of the detection signal from the radiation amount monitor 7, which signal is measured in advance, and the opening/closing information of the shutter 51, which information is always input thereto. Furthermore, the lens controller 58 corrects the imaging characteristics, so that the variation of the imaging characteristics of the projection optical system PL falls within a predetermined allowable range.

The temporal variation of the imaging characteristics of the projection optical system PL includes, e.g., a magnification variation and a focus variation. In order to correct the magnification variation, the lens controller 58 changes the pressure of a certain lens chamber in the projection optical system PL to change the refractive index of air in the lens chamber, or moves some lenses in the projection optical system PL. In order to correct the focus variation, the lens controller 58 adds an offset to an oblique incident type focus system (not shown) to adjust the position, in the optical axis direction of the projection optical system PL, of the wafer stage 8 to a desired level, so that the imaging plane of the projection optical system PL coincides with the surface of the wafer W.

In FIG. 5, the main control system 24 is connected to an input device 34 such as a keyboard. An operator designates a region of illumination light IL which passes through the Fourier transform plane of the illumination optical system from the keyboard 34 to the main control system 24. Also, the type of the reticle R, the minimum pitch of a pattern to be transferred, and the like may be input to the input device 34, and the main control system 24 may calculate an optimal region of illumination light IL which passes through the Fourier transform plane of the illumination optical system on the basis of the input information. In FIG. 5, the exposure amount control part 54 and the lens controller 58 are connected through the main control system 24. Alternatively, the exposure amount control part 54 and the lens controller 58 may be initially designed as a combined control part.

An exposure operation of the projection exposure apparatus of this embodiment will be described below. In FIG. 5, when the reticle R is the phase shift reticle which has already been described above, exposure must be performed with a small $\sigma$ value of the illumination optical system. Thus, the operator inputs the $\sigma$ value of the illumination optical system to the main control system 24 via the input device 34. The main control system 24 designates the input $\sigma$ value in the illumination system control part 55, and the illumination system control part 55 sets the aperture diameter of the variable aperture stop 50 to be a value corresponding to the designated a value.

Note that the value input from the input device 34 is not limited to the $\sigma$ value of the illumination optical system. For example, the pattern density on the reticle R, information indicating whether or not the reticle R is a phase shift reticle, the type of the phase shift reticle, or the like may be input. In this case, the main control system 24 calculates an optimal $\sigma$ value for the reticle on the basis of the input information, and designates the calculated $\sigma$ value in the illumination system control part 55.

Some light components of illumination light IL passing through the variable aperture stop 50 are reflected by the beam splitter 52 and are incident on the light-receiving surface of the integrator sensor 53. A photoelectric conversion signal from the integrator sensor 53 is supplied to the exposure amount control part 54. The exposure amount control part 54 indirectly calculates an exposure amount (exposure energy) on the wafer W on the basis of the photoelectric conversion signal from the integrator sensor 53. When the exposure amount reaches a proper exposure amount determined in advance for the wafer W, the exposure amount control part 54 closes the shutter 51.

However, the distribution of incident angles of light incident on the integrator sensor 53 varies depending on the shape and size of the aperture of the variable aperture stop 50, and the conversion efficiency between the light-receiving amount of illumination light and the output current amount of the integrator sensor 53 changes accordingly. Therefore, a conversion coefficient used when a precise intensity of illumination light incident on the integrator sensor 53 is calculated from the output signal of the integrator sensor 53 also changes depending on the shape and size of the aperture of the variable aperture stop 50. Thus, conversion coefficients calculated as a function of the shape and size of the aperture of the variable aperture stop 50 are pre-stored in the exposure amount control part 54.

Figure 6A:
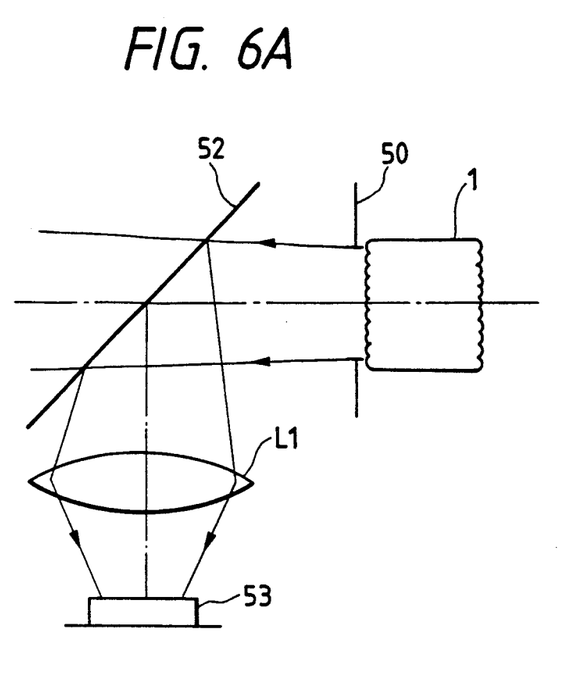
FIG. 6A is an optical path diagram showing the state of light beams reaching an integrator sensor 8 when an illumination optical system has a large $\sigma$ value.
Figure 6B:
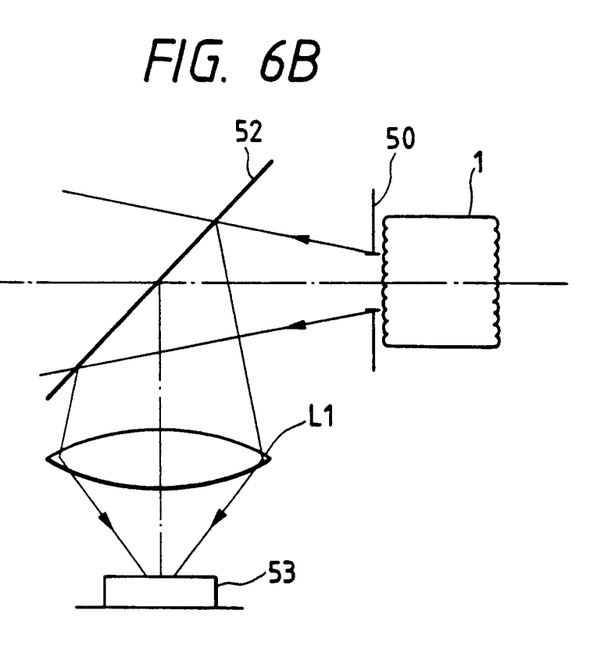
FIG. 6B is an optical path diagram showing the state of light beams reaching the integrator sensor 8 when the illumination optical system has a small $\sigma$ value.

A change in conversion coefficient will be described in detail below with reference to FIGS. 6A and 6B. FIG. 6A shows a case wherein the $\sigma$ value of the illumination optical system is large, and FIG. 6B shows a case wherein the $\sigma$ value of the illumination optical system is small. In FIGS. 6A and 6B, the light-receiving surface of the integrator sensor 53 is almost conjugate with the arranging plane of the variable aperture stop 50. As can be understood from a comparison between FIGS. 6A and 6B, the incident angle range of incident light on the integrator sensor 53 and the light spot size on the light-receiving surface of the integrator sensor 53 change according to the $\sigma$ value.

As the integrator sensor 53, a photoelectric conversion element such as a silicon photodiode (SPD) is used. The photoelectric conversion signal from such a photoelectric conversion element normally suffers from angle dependency due to an incident angle, and sensitivity nonuniformity depending on the position on the light-receiving surface. For this reason, when the region of illumination light IL passing through the Fourier transform plane of the illumination optical system changes, as shown in FIGS. 6A and 6B, exposure amount control cannot be precisely performed.

Thus, the exposure amount control part 54 shown in FIG. 5 obtains in advance a correction coefficient (conversion coefficient) corresponding to the region of illumination light IL passing through the Fourier transform plane of the illumination optical system, i.e., the $\sigma$ value of the illumination optical system. The control part 54 multiplies the photoelectric signal from the integrator sensor 53 with this conversion coefficient to calculate a precise intensity of illumination light incident on the integrator sensor 53.

The conversion coefficient is obtained with reference to an output signal from the integrator sensor 53 when the conversion efficiency between the light-receiving amount and the output current amount of the integrator sensor 53 is most satisfactory as in the first embodiment. More specifically, an output signal Ic from the integrator sensor when illumination light incident on the integrator sensor 53 consists of only illumination light components perpendicular to the light-receiving surface is used as a reference signal. Even when illumination light is incident on the integrator sensor to have a certain angle distribution, the output signal from the integrator sensor need only be almost equal to the output signal Ic or fall within a certain allowable range. More specifically, when the conversion efficiency is almost equivalent to that of the integrator sensor obtained when illumination light consists of only illumination light components perpendicular to the light-receiving surface, an output signal at that time can be used as a reference signal.

Assume that an output current amount Ia obtained when the $\sigma$ value is, e.g., 0.2 is used as a reference value. Then, the diameter of the aperture stop 50 is set so that the light amount of illumination light transmitted through the aperture stop 50 becomes twice that obtained when the $\sigma$ value is 0.2 (the $\sigma$ value at this time is assumed to be 0.4). Thereafter, illumination light is radiated onto the integrator sensor 53. An output current amount Ib obtained from the integrator sensor 53 is compared with 21a, thereby obtaining the conversion coefficient when the $\sigma$ value is 0.4.

Upon repetition of this operation, a series of conversion coefficients which change depending on the region of illumination light IL passing through the Fourier transform plane of the illumination optical system can be obtained as a function of the corresponding region (the $\sigma$ value in this embodiment).

The exposure amount control part 54 calculates the intensity of illumination light incident on the integrator sensor 53 using this conversion coefficient, and also calculates an exposure amount radiated onto the wafer W. The exposure amount control part 54 controls the opening/closing state of the shutter 51 on the basis of the accumulated value of the exposure amounts, thus achieving precise exposure amount control.

As for the radiation amount monitor 7, the incident angle distribution of a light beam incident on the radiation amount monitor 7 varies depending on the shape and size of the aperture of the variable aperture stop 50, and the conversion efficiency of the light-receiving amount of illumination light and the output current amount of the radiation amount monitor 7 change in the same manner as described above. Therefore, the intensity of illumination light incident on the radiation amount monitor 7 can be precisely calculated by correcting the output signal from the radiation amount monitor in the same manner as described above. The output signal from the radiation amount monitor 7 is caused to correspond to the output signal from the integrator sensor 53 in advance.

Even when the modified light source method or zone illumination method, for example, is used, precise exposure amount control is achieved by performing the same correction as above. This will be described below with reference to FIGS. 7 and 8. The same reference numerals in FIGS. 7 and 8 denote the same parts as in FIGS. 5 and 6, and a detailed description thereof will be omitted.

Figure 7:
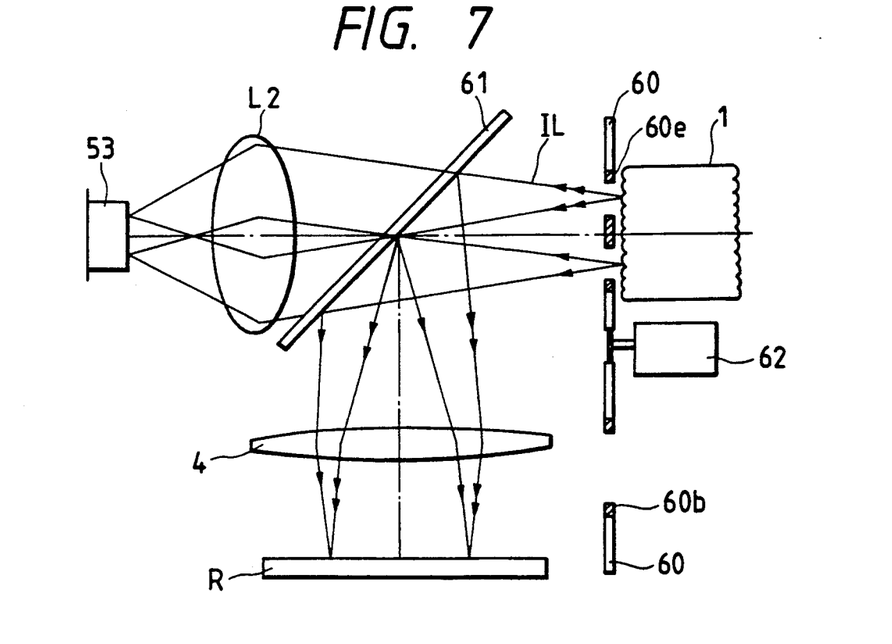
FIG. 7 is an optical path diagram showing the state of light beams incident on the integrator sensor when the illumination optical system adopts a modified light source method.

FIG. 7 is an optical path diagram showing the state of light beams incident on the integrator sensor 53 when the illumination optical system adopts the modified light source method. In FIG. 7, illumination light IL emerging from the fly-eye lens 1 passes through an aperture portion of a filter 60e provided to a turret plate 60 arranged near the Fourier transform plane (pupil plane) of the illumination optical system. The illumination light IL passing through the aperture portion of the filter 60e is incident on a mirror (beam splitter) 61 which has a high reflectance, and allows some light components of the illumination light IL to pass therethrough. The illumination light IL reflected by the beam splitter 61 is radiated onto a reticle via the condenser lens 4. The illumination light IL transmitted through the beam splitter 61 is focused by the focusing lens L2, and is incident on the light-receiving surface of the integrator sensor 53. The integrator sensor 60 is arranged on a plane (conjugate plane) having an imaging relationship with the arranging plane of the filter 60e.

Figure 8:
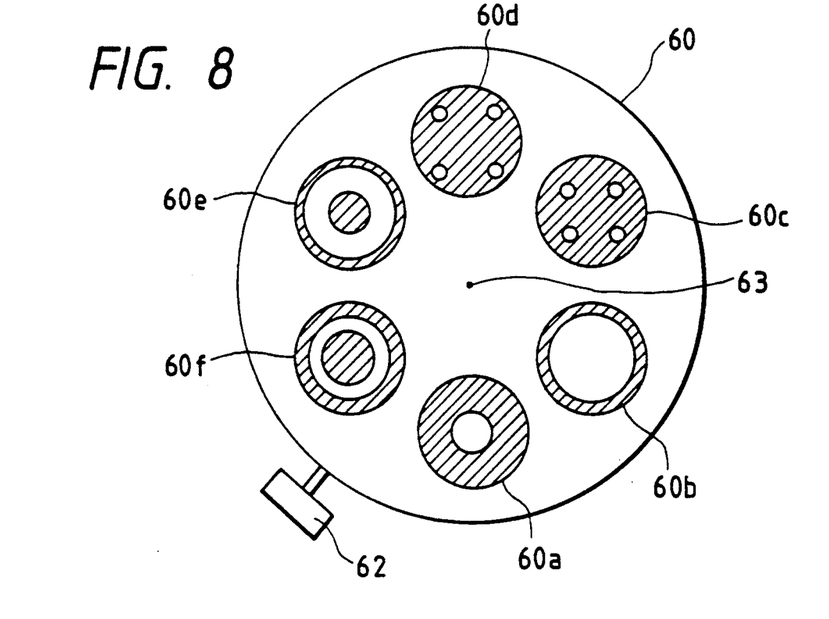
FIG. 8 is a plan view showing an arrangement of a turret plate 60 shown in FIG. 7.

FIG. 8 is a view showing the turret plate 60 when viewed from the direction of the optical axis AX of illumination light. This turret plate 60 has a disk shape, and six circular filters 60a to 60f are arranged on a concentric circle to have a rotational shaft 63 as a center. As shown in FIG. 8, the filters 60a and 60b have circular apertures, and the diameters of these circular apertures are different from each other. Each of the filters 60c and 60d has four circular apertures, and is used for the modified light source method. The filters 60c and 60d have different intervals (distances) between the centers of the circular apertures. The filters 60e and 60f are used for the zone illumination method, and have different widths (all of the inner and outer diameters and the zone ratio) of ring-shaped aperture portions. A drive part 62 rotates the turret plate 60 about the central point 63, and places a desired filter, so that the central point of the filter coincides with the optical axis AX of illumination light.

Even when the filters have different shapes of aperture portions, as shown in FIG. 8, conversion functions corresponding to conditions in units of regions of the aperture portions of the filters, i.e., in units of illumination methods can be obtained in advance.

Furthermore, as shown in FIGS. 7 and 8, the light-receiving surface of the integrator sensor 53 is arranged on a plane almost conjugate with the Fourier transform plane (pupil plane) of the illumination optical system, but may be arranged on, e.g., a plane conjugate with the pattern surface of the reticle R. Thus, the position of the integrator sensor is not particularly limited.

In each of the above embodiments, the output from the integrator sensor or the radiation amount monitor is corrected in accordance with incident conditions of illumination light, and the corrected signal, i.e., the light intensity of illumination light is integrated. Then, exposure amount control is performed on the basis of the integrated value. However, in place of correcting the output signal from the sensor, a proper exposure amount corresponding to sensitivity characteristics of a resist may be corrected in accordance with incident conditions, and shutter opening/closing control (at least one of energy in units of one to several pulses and the total number of pulses necessary for exposing one shot in a pulse light source such as an excimer laser) may be made, so that the integrated value of the outputs from the sensor becomes the corrected proper exposure amount.

What is claimed is:

1. An exposure apparatus comprising:
   an illumination optical system for radiating illumination light into a mask so as to expose a pattern of said mask on a photosensitive substrate;
   photoelectric detection means for photoelectrically detecting at least some light components of the illumination light;
   input means for inputting information associated with an incident angle range of the illumination light incident on a light-receiving surface of said photoelectric detection means; and
   measurement means for correcting a level of an output signal from said photoelectric detection means in accordance with the input information, and measuring an intensity of the illumination light incident on said photoelectric detection means.

2. An apparatus according to claim 1, wherein said measurement means comprises storage means for storing a conversion coefficient for converting the level of the output signal from said photoelectric detection means into the intensity of the illumination light incident on said photoelectric detection means as a function corresponding to the information associated with the incident angle range.

3. An apparatus according to claim 1, further comprising:
   a stage, which carries said photosensitive substrate, and moves in a predetermined direction,
   said photoelectric detection means being arranged on said stage.

4. An apparatus according to claim 1, wherein said photoelectric detection means is arranged outside an optical path of said illumination optical system, and said apparatus further comprises:
   a detection optical system for guiding at least some light components of the illumination light radiated on said mask to said photoelectric detection means, and establishing an almost conjugate relationship between the light-receiving surface of said photoelectric detection means and a Fourier transform plane located in said illumination optical system and associated with a pattern surface of said mask.

5. An exposure apparatus comprising:
   an illumination optical system for radiating illumination light into a mask so as to expose a pattern of said mask on a photosensitive substrate;
   an optical member, arranged in said illumination optical system, for setting a light amount distribution of the illumination light passing through a Fourier transform plane located in said illumination optical system and associated with a pattern surface of said mask or a plane near the Fourier transform plane in correspondence with the pattern on said mask;

photoelectric detection means for photoelectrically detecting at least some light components of the illumination light emerging from said optical member; and measurement means for correcting a level of an output signal from said photoelectric detection means in accordance with the light amount distribution, and measuring an intensity of the illumination light incident on said photoelectric detection means.

6. An apparatus according to claim 5, wherein said measurement means comprises storage means for storing a conversion coefficient for converting the level of the output signal from said photoelectric detection means into the intensity of the illumination light incident on said photoelectric detection means as a function corresponding to the information associated with the light amount distribution.

7. An apparatus according to claim 5, further comprising:

a stage, which carries said photosensitive substrate, and moves in a predetermined direction, said photoelectric detection means being arranged on said stage.

8. An apparatus according to claim 5, wherein said photoelectric detection means is arranged outside an optical path of said illumination optical system, and said apparatus further comprises:

a detection optical system for guiding at least some light components of the illumination light radiated on said mask to said photoelectric detection means, and establishing an almost conjugate relationship between the light-receiving surface of said photoelectric detection means and a Fourier transform plane located in said illumination optical system and associated with a pattern surface of said mask.

9. An apparatus according to claim 5, wherein said optical member has a variable aperture stop arranged on or near the Fourier transform plane in said illumination optical system so as to allow a coherence factor of said illumination optical system to be variable.

10. An apparatus according to claim 5, wherein said optical member sets the light amount distribution on the Fourier transform plane in said illumination optical system to be maximal in at least one partial region decentered from an optical axis of said illumination optical system, said optical member has a movable member for moving a position of the partial region in the Fourier transform plane in said illumination optical system, and said measurement means corrects the level of the output signal from said photoelectric detection means in accordance with a distance between the optical axis and a position of center of gravity of the light amount distribution of the illumination light on the partial region.

11. An exposure apparatus comprising:

an illumination optical system for radiating illumination light into a mask so as to expose a pattern of said mask on a photosensitive substrate;

photoelectric detection means for photoelectrically detecting at least some light components of the illumination light;

input means for inputting information associated with an incident angle range of the illumination light incident on a light-receiving surface of said photoelectric detection means; and control means for controlling an amount of the illumination light radiated on said mask on the basis of the input information and an output signal from said photoelectric detection means, so that an accumulated light amount of the illumination light radiated on said photosensitive substrate becomes a proper exposure amount according to photosensitive characteristics of said photosensitive substrate upon exposure of the pattern on said mask.

12. An apparatus according to claim 11, further comprising:

a stage, which carries said photosensitive substrate, and moves in a predetermined direction, said photoelectric detection means being arranged on said stage.

13. An apparatus according to claim 11, wherein said photoelectric detection means is arranged outside an optical path of said illumination optical system, and said apparatus further comprises:

a detection optical system for guiding at least some light components of the illumination light radiated on said mask to said photoelectric detection means, and establishing an almost conjugate relationship between the light-receiving surface of said photoelectric detection means and a Fourier transform plane located in said illumination optical system and associated with a pattern surface of said mask.

14. An exposure method for exposing a pattern on a mask onto a photosensitive substrate by radiating illumination light onto said mask via an illumination optical system, comprising the steps of:

receiving at least some light components of the illumination light by a photoelectric detector before or during the exposure operation; and controlling an amount of the illumination light radiated on said mask on the basis of information associated with an incident angle range of the illumination light incident on said photoelectric detector and an output signal from said photoelectric detector, so that an accumulated light amount of the illumination light radiated on said photosensitive substrate becomes a proper exposure amount according to photosensitive characteristics of said photosensitive substrate upon exposure of the pattern on said mask.

* * * * *